(12) United States Patent
Kurata et al.

(10) Patent No.: US 8,030,773 B2
(45) Date of Patent: Oct. 4, 2011

(54) SEMICONDUCTOR INTEGRATED CIRCUIT DEVICE COMPRISING DIFFERENT LEVEL INTERCONNECTION LAYERS CONNECTED BY CONDUCTOR LAYERS INCLUDING CONDUCTOR LAYER FOR REDUNDANCY

(75) Inventors: Nobuhiko Kurata, Yokohama (JP); Kouichirou Inoue, Yokosuka (JP); Shinji Fujii, Yokohama (JP); Muneaki Maeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1167 days.

(21) Appl. No.: 11/752,999

(22) Filed: May 24, 2007

(65) Prior Publication Data

US 2007/0273028 A1    Nov. 29, 2007

(30) Foreign Application Priority Data

May 26, 2006    (JP) .................................. 2006-146520

(51) Int. Cl.
*H01L 23/48*    (2006.01)
*H01L 23/52*    (2006.01)
*H01L 29/40*    (2006.01)

(52) U.S. Cl. .................................. 257/758; 257/E23.145
(58) Field of Classification Search .................. 257/758, 257/E23.145
See application file for complete search history.

(56) References Cited

U.S. PATENT DOCUMENTS

| 5,378,927 | A | * | 1/1995 | McAllister et al. | 257/773 |
| 5,798,937 | A | * | 8/1998 | Bracha et al. | 716/54 |
| 2004/0101663 | A1 | * | 5/2004 | Agarwala et al. | 428/209 |
| 2004/0245648 | A1 | * | 12/2004 | Nagasawa et al. | 257/772 |
| 2005/0108673 | A1 | * | 5/2005 | Ota | 716/13 |
| 2005/0240884 | A1 | * | 10/2005 | Frederick et al. | 716/2 |
| 2005/0280159 | A1 | * | 12/2005 | Okumura | 257/774 |
| 2006/0014376 | A1 | * | 1/2006 | Agarwala et al. | 438/622 |
| 2006/0086965 | A1 | * | 4/2006 | Sakaguchi et al. | 257/307 |
| 2007/0111342 | A1 | * | 5/2007 | Satya et al. | 438/17 |
| 2008/0072203 | A1 | * | 3/2008 | Reuter et al. | 716/14 |
| 2008/0097738 | A1 | * | 4/2008 | Anderson et al. | 703/14 |

FOREIGN PATENT DOCUMENTS

JP    2001-284455    10/2001

* cited by examiner

*Primary Examiner* — Kiesha Bryant
*Assistant Examiner* — Igwe U Anya
(74) *Attorney, Agent, or Firm* — Turocy & Watson, LLP

(57) ABSTRACT

A third interconnection layer is disposed near a first interconnection layer and a second interconnection layer disposed above the first interconnection layer. The first interconnection layer and second interconnection layer are connected to each other by a regular via plug and a via plug for redundancy. The via plug for redundancy is disposed by the side of the regular via plug and between the regular via plug and the third interconnection layer. An extended portion of the second interconnection layer is extended from a portion connected to the via plug for redundancy on the second interconnection layer toward the third interconnection layer. The extended portion has a dimension smaller than the minimum dimension prescribed in the interconnection line design rule.

5 Claims, 4 Drawing Sheets

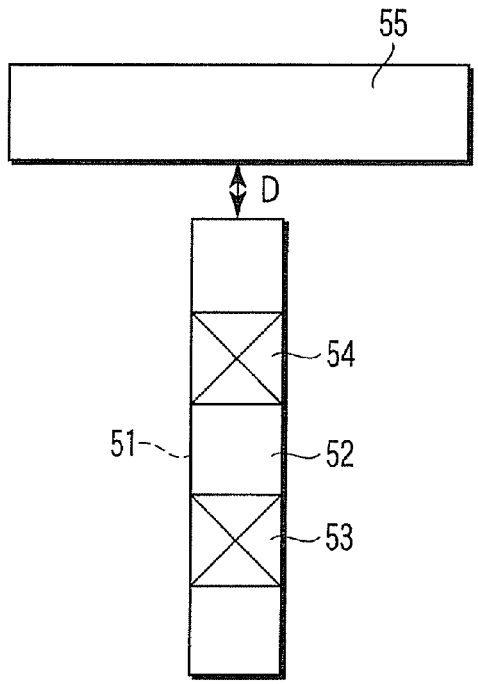
F I G. 5A
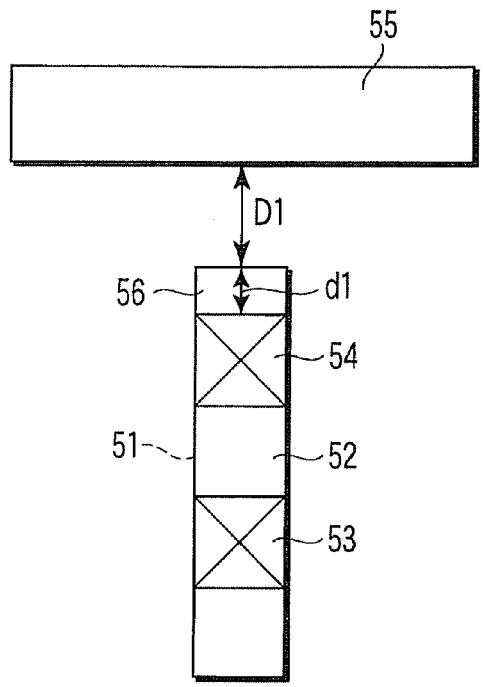
F I G. 5B
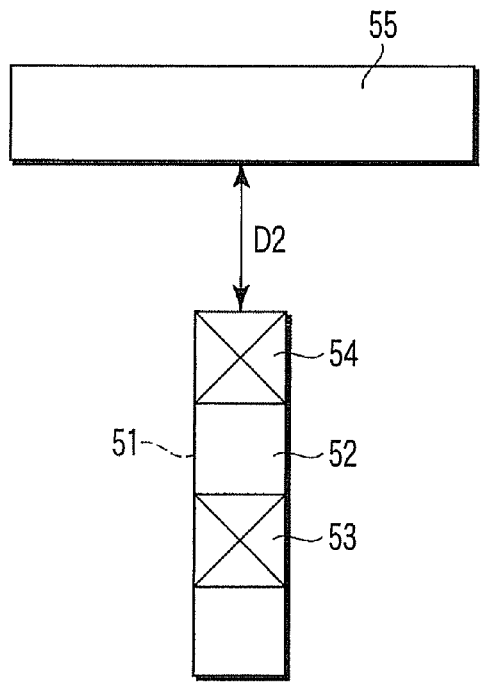
F I G. 5C

SEMICONDUCTOR INTEGRATED CIRCUIT DEVICE COMPRISING DIFFERENT LEVEL INTERCONNECTION LAYERS CONNECTED BY CONDUCTOR LAYERS INCLUDING CONDUCTOR LAYER FOR REDUNDANCY

CROSS-REFERENCE TO RELATED APPLICATIONS

This application is based upon and claims the benefit of priority from prior Japanese Patent Application No. 2006-146520, filed May 26, 2006, the entire contents of which are incorporated herein by reference.

BACKGROUND OF THE INVENTION

1. Field of the Invention

The present invention relates to a semiconductor integrated circuit device, and particularly to a pattern of a plurality of interconnection lines connected to each other by a plurality of via or contact plugs in a semiconductor integrated circuit device provided with a redundancy layout design.

2. Description of the Related Art

In semiconductor integrated circuit devices (LSI) having high integration degrees, generation change or progress requires design rules for realizing designs with smaller pattern shapes. However, with a decrease in the size of pattern shapes, the number of defects is increased due to accidental factors and process fluctuations caused in the manufacturing process. In order to prepare for occurrence of such defects and thereby to improve the yield rate, pattern layout designs are arranged to employ a redundant structure dispensable for the operation, as a defect countermeasure.

In this respect, Jpn. Pat. Appln. KOKAI Publication No. 2001-284455 discloses the following technique. Specifically, via regions respective formed on the layers of interconnection lines are set to have essentially the same width as the line width of the respective interconnection layers. Where a via hole is formed at an end of an interconnection line, this via hole is elongated beyond the end of the interconnection line by a predetermined length in the length direction of the interconnection line. Consequently, it is possible to suppress problems in relation to minimum areas and/or the end of lines.

BRIEF SUMMARY OF THE INVENTION

According to a first aspect of the present invention, there is provided a semiconductor integrated circuit device comprising: a first interconnection layer and a second interconnection layer disposed above the first interconnection layer, a third interconnection layer disposed near the first and second interconnection layers, a first conductor layer electrically connecting the first and second interconnection layers to each other, a second conductor layer for redundancy, disposed by a side of the first conductor layer and between the first conductor layer and the third interconnection layer, and electrically connecting the first and second interconnection layers to each other; and an extended portion of the second interconnection layer extended from a portion connected to the second conductor layer on the second interconnection layer toward the third interconnection layer, and having an extended dimension smaller than a minimum dimension prescribed in an interconnection line design rule.

According to a second aspect of the present invention, there is provided a semiconductor integrated circuit device comprising: a first interconnection layer and a second interconnection layer disposed above the first interconnection layer, a third interconnection layer disposed near the first and second interconnection layers, a first conductor layer electrically connecting the first and second interconnection layers to each other, and a second conductor layer for redundancy, disposed by a side of the first conductor layer and at an end of the second interconnection layer between the first conductor layer and the third interconnection layer, and electrically connecting the first and second interconnection layers to each other, no portion of the second interconnection layer being extended from a portion connected to the second conductor layer on the second interconnection layer toward the third interconnection layer.

BRIEF DESCRIPTION OF THE SEVERAL VIEWS OF THE DRAWING

FIG. 5A is a plan view showing an LSI before a first or second embodiment is applied thereto;

FIG. 5B is a plan view showing an LSI according to the first embodiment;

FIG. 5C is a plan view showing an LSI according to the second embodiment;

DETAILED DESCRIPTION OF THE INVENTION

Embodiments of the present invention will now be described with reference to the accompanying drawings. In the embodiments described below, the present invention is applied to a structure in which a set of interconnection layers is formed of a first interconnection layer used as an interconnection line and a second interconnection layer used as an interconnection line disposed thereabove, and the interconnection layers are electrically connected to each other by a plurality of via plugs. However, the present invention may be applied to a structure in which a set of interconnection layers is formed of a first interconnection layer defined by a diffusion region of a semiconductor substrate and a second interconnection layer used as an interconnection line disposed thereabove, and the interconnection layers are electrically connected to each other by a plurality of contact plugs. In the following explanation, via plugs and contact plugs are collectively referred to as conductor layers.

Figure 1:
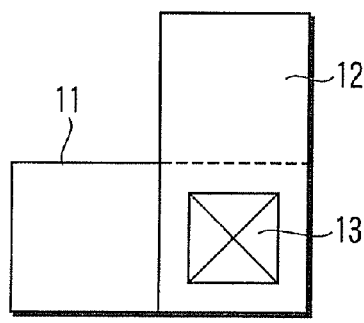
FIG. 1 is a plan view showing an example of a typical LSI.

Of the defects caused in LSIs, disconnection and short of interconnection lines are defects relatively easily brought about, and the following method is used as a countermeasure for such defects, in general. For example, as shown in FIG. 1, a layout design is arranged such that an interconnection layer on the lower level (lower interconnection layer) 11 and an interconnection layer on the upper level (upper interconnection layer) 12 are connected to each other by one via plug 13.

Figure 2:
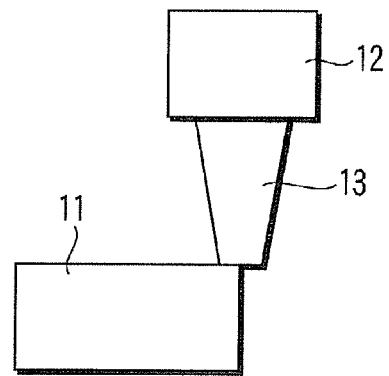
FIG. 2 is a sectional view showing a state of the LSI shown in FIG. 1 manufactured after a layout design.

In this case, for example, when the via plug actually fabricated has a vertically cross-sectional structure shown in FIG. 2, the following problem arises.

Specifically, where the lower interconnection layer 11 has been formed shorter than the designed value, the contact area between the upper interconnection layer 12 and via plug 13 is not smaller, but the contact area between the lower interconnection layer 11 and via plug 13 is smaller. Consequently, the interconnection layers 11 and 12 may be electrically not connected to each other.

Figure 3:
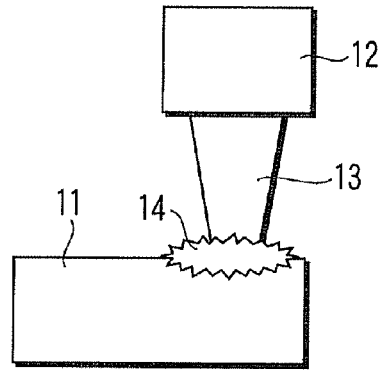
FIG. 3 is a sectional view showing a state of the LSI shown in FIG. 1 manufactured after a layout design.

Further, as shown in FIG. 3, a contaminant 14 may be deposited on the lower interconnection layer 11 in the manufacturing process, and left below the via plug 13 formed thereafter. In this case, the interconnection layers 11 and 12 may be electrically not connected to each other, thereby bringing about a defect.

Figure 4:
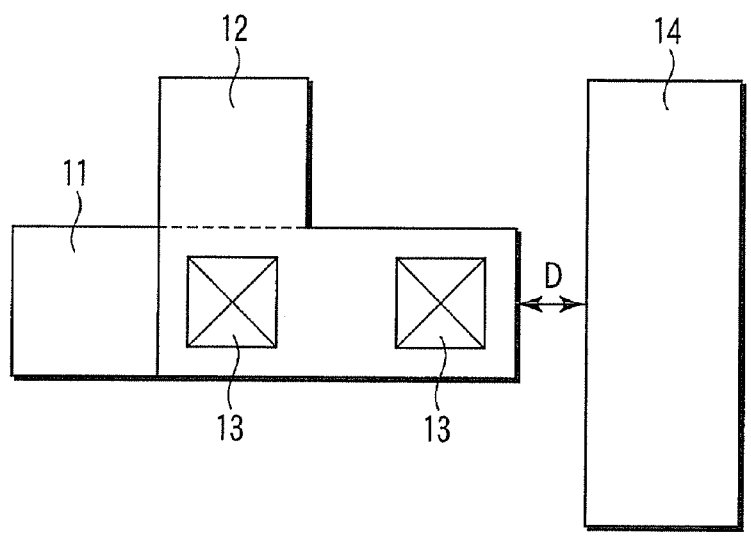
FIG. 4 is a plan view showing another example of a typical LSI.

In order to suppress a decrease in yield rate due to such defects, there is known a redundancy layout structure in which two via plugs 13 are disposed side by side between a set of interconnection layers formed of a lower interconnection layer 11 and an upper interconnection layer 12, as shown in FIG. 4. With this structure, even if one of the two via plugs 13 becomes defective, the interconnection layers 11 and 12 are still electrically connected to each other by the other via plug 13, thereby improving the yield rate.

However, where another interconnection layer 14 is present near the interconnection layer 12, the distance D between the interconnection layers 12 and 14 is decreased, and thereby commits a violation of the minimum distance prescribed in a design rule. Where the positions of the via plugs 13 cannot be shifted, the interconnection layer 14 may be shifted to expand the distance D, but the layout area is increased by that much.

First Embodiment

FIG. 5A is a plan view showing an example of an LSI before the present invention is applied thereto. In the uncorrected pattern layout shown in FIG. 5A, a set of interconnection layers are formed of a linear lower interconnection layer 51 and a linear upper interconnection layer 52, which overlap with each other in the vertical direction. Two via plugs 53 and 54 are disposed side by side between the set of interconnection layers 51 and 52. The via plug 53 or one of the two via plugs 53 and 54 is a regular via plug, while the other via plug 54 is a via plug for redundancy. The two via plugs 53 and 54 are covered with the upper interconnection layer 52 in accordance with the minimum value prescribed in a design rule. Specifically, the upper interconnection layer 52 has an interconnection line width in a direction perpendicular to the length direction thereof. The via plugs 53 and 54 have an interconnection line width in a direction perpendicular to the length direction of the upper interconnection layer 52. The interconnection line width of the via plugs 53 and 54 is equal to the interconnection line width of the upper interconnection layer 52.

A third interconnection layer formed of an interconnection layer 55 is disposed near the upper interconnection layer 52. The interconnection line margin relative to the via plug 54 for redundancy is set to be sufficient in the length direction of the upper interconnection layer 52. Consequently, the distance D between the interconnection layers 52 and 55 commits a violation of the minimum distance prescribed in the design rule.

In this case, for example, a corrected pattern layout is formed, as shown in FIG. 5B. Specifically, FIG. 5B is a view showing an example of an LSI having a corrected pattern layout according to a first embodiment. A set of interconnection layers is formed of a linear lower interconnection layer (first interconnection layer) 51 and a linear upper interconnection layer (second interconnection layer) 52, which overlap with each other in the vertical direction. Two via plugs 53 and 54 are disposed side by side between the set of interconnection layers 51 and 52. The via plug 53 or one of the two via plugs 53 and 54 has the same interconnection line margin as that of an ordinary interconnection line on which only one via plug is disposed (standard marginal value). The other via plug 54 for redundancy has a smaller dimensional margin relative to the interconnection line to which the via plug 54 is connected. In this case, the interconnection line margin relative to the via plug 54 for redundancy in the length direction of the interconnection layer 52 is set to be smaller than the minimum dimension prescribed in the interconnection line design rule. In other words, the upper interconnection layer 52 is extended from the portion connected to the via plug 54 toward the interconnection layer 55, and the extended dimension d1 of this extended portion 56 is set to be smaller than the minimum dimension prescribed in the interconnection line design rule. Consequently, the minimum distance D1 (>D) prescribed in the design rule is obtained between the interconnection layer 52 and the interconnection layer 55 adjacent thereto, thereby preventing a violation of the design rule minimum distance.

The LSI according to the first embodiment is manufactured by use of the following designing method in designing the interconnection line layout. Specifically, where a redundant via plug is present, an eased restriction is applied to the design rule for the redundant portion layout, as compared to the restriction applied to the design rule where no redundant portion is present.

Where such a pattern layout is adopted, the defect rate of the via plug 54 becomes higher, but the defect rate of the entire structure becomes lower than a structure provided with only one via plug. Consequently, it is possible to improve the yield rate without increasing the layout area.

Second Embodiment

FIG. 5C is a view showing an example of an LSI having a corrected pattern layout according to a second embodiment, which is derived from the LSI shown in FIG. 5A. In FIG. 5, the via plug 54 is formed at the end of the upper interconnection layer 52, so that no interconnection line margin relative to the via plug 54 is present in the length direction of the interconnection layer 52. In other words, the upper interconnection layer 52 is not extended from the portion connected to the via plug 54 toward the interconnection layer 55, and thus the extended portion 56 shown in FIG. 5B is not formed on the upper interconnection layer 52.

With this arrangement, a distance D2 larger than the minimum distance D1 prescribed in the design rule is obtained between the interconnection layers 52 and 55, thereby preventing a violation of the design rule minimum distance. Further, where such a pattern layout is adopted, it is possible to obtain the same effect as the LSI according to the first embodiment shown in FIG. 5B.

Third Embodiment

Figure 6A:
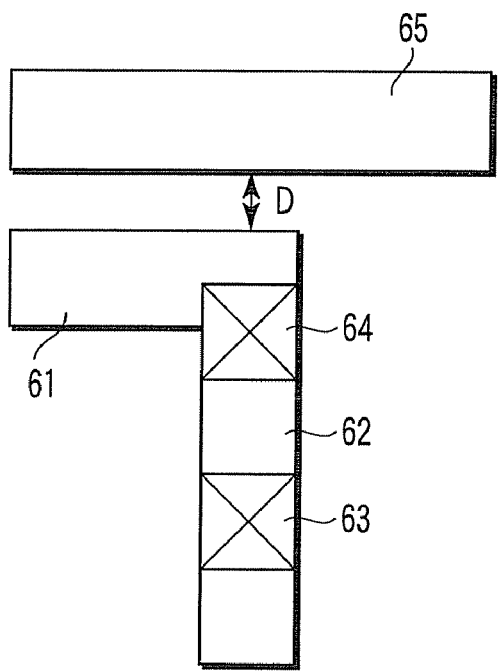
FIG. 6A is a plan view showing an LSI before a third embodiment is applied thereto.

FIG. 6A is a plan view showing an example of an LSI before the present invention is applied thereto. In the uncorrected pattern layout shown in FIG. 6A, a set of interconnection layers are formed of a lower interconnection layer 61 and an upper interconnection layer 62, which intersect with each other and form an L-shape in the plan view. Two via plugs 63 and 64 are disposed side by side between the set of interconnection layers 61 and 62. The via plug 63 or one of the two via plugs 63 and 64 is a regular via plug, while the other via plug 64 is a via plug for redundancy. The two via plugs 63 and 64 are covered with the upper interconnection layer 62 in accordance with the minimum value prescribed in a design rule. A third interconnection layer formed of an interconnection layer 65 is disposed near the upper interconnection layer 62. The distance D between the interconnection layers 62 and 65 commits a violation of the minimum distance prescribed in the design rule.

Figure 6B:
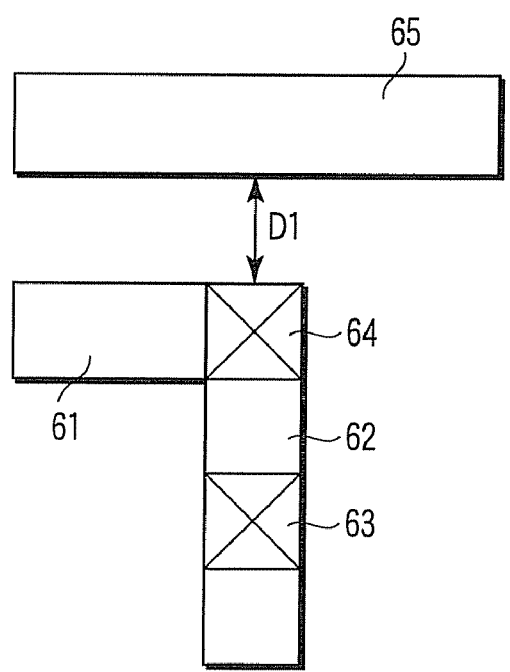
FIG. 6B is a plan view showing an LSI according to the third embodiment.

In this case, for example, a corrected pattern layout is formed, as shown in FIG. 6B. Specifically, FIG. 6B is a view showing an example of an LSI having a corrected pattern layout according to a third embodiment. A set of interconnection layers is formed of a lower interconnection layer (first interconnection layer) 61 and an upper interconnection layer (second interconnection layer) 62, which intersect with each other and form an L-shape in the plan view. Two via plugs 63 and 64 are disposed side by side between the set of interconnection layers 61 and 62. The via plug 63 or one of the two via plugs 63 and 64 has the same interconnection line margin as that of an ordinary interconnection line on which only one via plug is disposed (standard marginal value). The via plug 64 disposed at the corner of the L-shape has a smaller dimensional margin in the length direction of the interconnection layer 62. In this case, the two via plugs 63 and 64 are disposed side by side between the set of interconnection layers 61 and 62, which intersect with each other and form the L-shape in the plan view, such that no interconnection line margin relative to the via plug 64 is present in the length direction of the interconnection layer 62. In other words, the upper interconnection layer 62 is not extended from the portion connected to the via plug 64 toward the interconnection layer 65, and thus no extended portion is formed on the upper interconnection layer 62.

With this arrangement, the minimum distance D1 (>D) prescribed in the design rule is obtained between the interconnection layers 62 and 65, thereby preventing a violation of the design rule minimum distance.

Where such a pattern layout is adopted, the defect rate of the via plug 64 becomes higher, but the defect rate of the entire structure becomes lower than a structure provided with only one via plug. Consequently, it is possible to improve the yield rate without increasing the layout area.

Fourth Embodiment

Figure 7A:
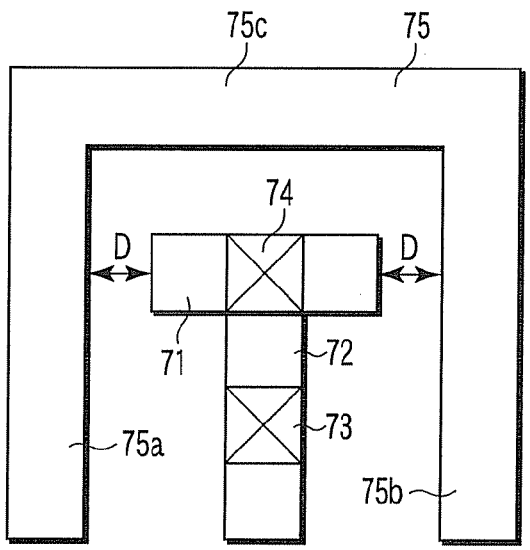
FIG. 7A is a plan view showing an LSI before a fourth or fifth embodiment is applied thereto.

FIG. 7A is a plan view showing an example of an LSI before the present invention is applied thereto. In the uncorrected pattern layout shown in FIG. 7A, a set of interconnection layers are formed of a lower interconnection layer 71 and an upper interconnection layer 72, which intersect with each other and form a T-shape in the plan view. Two via plugs 73 and 74 are disposed side by side between the set of interconnection layers 71 and 72. The via plug 73 or one of the two via plugs 73 and 74 is a regular via plug, while the other via plug 74 is a via plug for redundancy. The two via plugs 73 and 74 are covered with the upper interconnection layer 72 in accordance with the minimum value prescribed in a design rule. Specifically, the upper interconnection layer 72 has an interconnection line width in a direction perpendicular to the length direction thereof. The via plugs 73 and 74 have an interconnection line width in a direction perpendicular to the length direction of the upper interconnection layer 72. The interconnection line width of the via plugs 73 and 74 is equal to the interconnection line width of the upper interconnection layer 72. It should be noted that the length direction of the upper interconnection layer 72 corresponds to the longitudinal direction of the vertical portion in the vertical portion of the T-shape, while it corresponds to the longitudinal direction of the horizontal portion in the horizontal portion of the T-shape.

A third interconnection layer formed of an interconnection layer 75 is disposed near the interconnection layers 71 and 72. The interconnection layer 75 includes a first side portion 75a, a second side portion 75b, and a third side portion 75c disposed to surround the lower interconnection layer 71 and upper interconnection layer 72 on three sides. Specifically, the first and second side portions 75a and 75b extend in parallel with the length direction of the vertical portion of the T-shape formed by the lower interconnection layer 71 and upper interconnection layer 72. The third side portion 75c extends perpendicularly to the length direction of the vertical portion of the T-shape formed by the lower interconnection layer 71 and upper interconnection layer 72. Each of the distances D between the interconnection layers 72 and 75a and between the interconnection layers 72 and 75b commits a violation of the minimum distance prescribed in the design rule.

Figure 7B:
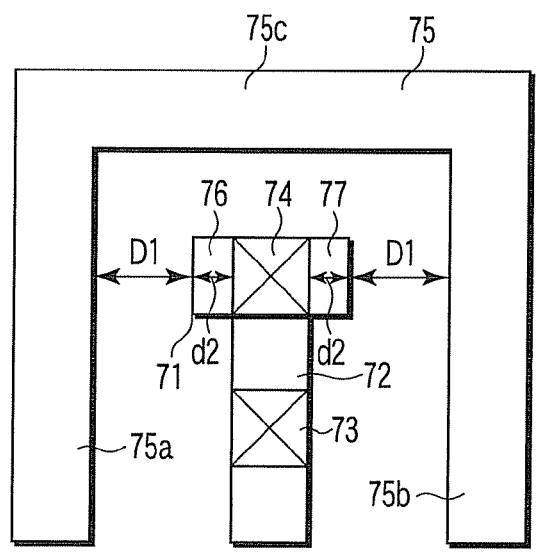
FIG. 7B is a plan view showing an LSI according to the fourth embodiment.

In this case, for example, a corrected pattern layout is formed, as shown in FIG. 7B. Specifically, FIG. 7B is a view showing an example of an LSI having a corrected pattern layout according to a fourth embodiment. A set of interconnection layers is formed of a lower interconnection layer (first interconnection layer) 71 and an upper interconnection layer (second interconnection layer) 72, which overlap with each other in the vertical direction and form an essentially linear shape in the plan view. Two via plugs 73 and 74 are disposed side by side between the set of interconnection layers 71 and 72. The via plug 73 or one of the two via plugs 73 and 74 has the same interconnection line margin as that of an ordinary interconnection line on which only one via plug is disposed (standard marginal value). The via plug 74 for redundancy is formed at the end of the length direction of the interconnection layer 72, and has a smaller interconnection line margin in the width direction of the interconnection layer 72.

Specifically, the interconnection layer 72 has a first extended portion 76 extended from the portion connected to the via plug 74 toward the first side portion 75a of the interconnection layer 75. Further, the interconnection layer 72 has a second extended portion 77 extended from the portion connected to the via plug 74 toward the second side portion 75b of the interconnection layer 75. Each of the extended dimensions d2 of the first and second extended portions 76 and 77 is set to be smaller than the minimum dimension prescribed in the interconnection line design rule. Consequently, the minimum distance D1 (>D) prescribed in the design rule is obtained between the extended portion 76 of the interconnection layer 72 and the interconnection layer 75 adjacent thereto, and is also obtained between the extended portion 77 of the interconnection layer 72 and the interconnection layer 75 adjacent thereto, thereby preventing a violation of the design rule minimum distance.

Where such a pattern layout is adopted, the defect rate of the via plug 74 becomes higher, but the defect rate of the entire structure becomes lower than a structure provided with only one via plug. Consequently, it is possible to improve the yield rate without increasing the layout area.

Fifth Embodiment

Figure 7C:
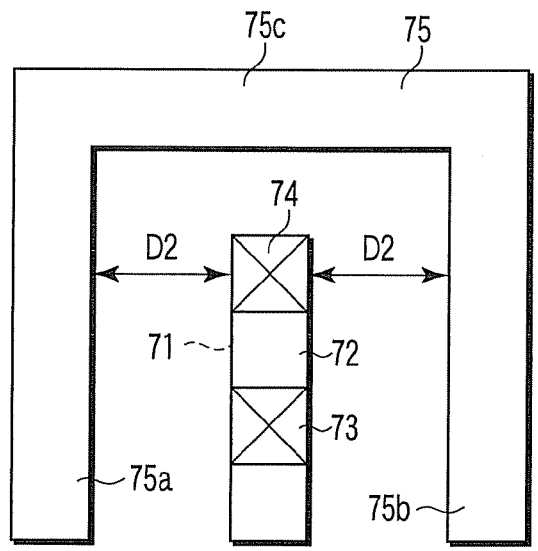
FIG. 7C is a plan view showing an LSI according to the fifth embodiment.

FIG. 7C is a view showing an example of a pattern layout of an LSI, which is obtained by correcting the pattern layout of the LSI shown in FIG. 7A. In other words, FIG. 7C is a view showing an example of an LSI having a corrected pattern layout according to a fifth embodiment. In FIG. 7C, the via plug 74 for redundancy is formed at the end of the interconnection layer 72 in the length direction, and no interconnection line margin relative to the via plug 74 is present in the width direction of the interconnection layer 72. In other words, the upper interconnection layer 72 is not extended from the portion connected to the via plug 74 toward the first side portion 75a of the interconnection layer 75, and thus the extended portion 76 shown in FIG. 7B is not formed on the upper interconnection layer 72. Further, the upper interconnection layer 72 is not extended from the portion connected to the via plug 74 toward the second side portion 75b of the interconnection layer 75, and thus the extended portion 77 shown in FIG. 7B is not formed on the upper interconnection layer 72.

With this arrangement, a distance D2 larger than the minimum distance D1 prescribed in the design rule is obtained between the interconnection layers 72 and 75, thereby preventing a violation of the design rule minimum distance. Further, where such a pattern layout is adopted, it is possible to obtain the same effect as the LSI according to the fourth embodiment shown in FIG. 7B.

In each of the embodiments described above, the positions of the first interconnection layer and second interconnection layer forming a set of interconnection layers may be reversed in the vertical direction. Further, the present invention may be applied to a case where a third interconnection layer is disposed not near the second interconnection layer but near the first interconnection layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    a first linear interconnection layer;
    a second linear interconnection layer having a same width as the first linear interconnection layer and having a portion disposed above the first linear interconnection layer to overlap with each other in a line direction, the second linear interconnection layer having one end portion;
    a third linear interconnection layer disposed near the second linear interconnection layer and apart from the one end portion of the second linear interconnection layer;
    a first conductor layer electrically connecting the first linear interconnection layer and the second linear interconnection layer to each other, and overlapping with the first linear interconnection layer and the second linear interconnection layer; and
    a second conductor layer for redundancy, disposed by a side of the first conductor layer and at the end portion of the second linear interconnection layer so as to face the third linear interconnection layer, and electrically connecting the first linear interconnection layer and the second linear interconnection layer to each other, no portion of the second linear interconnection layer being extended from a portion connected to the second conductor layer toward the third linear interconnection layer.

2. The semiconductor integrated circuit device according to claim 1, wherein the first linear interconnection layer is an interconnection layer disposed on or above a semiconductor substrate, and the first conductor layer and the second conductor layer are via plugs.

3. The semiconductor integrated circuit device according to claim 1, wherein the first linear interconnection layer is a diffusion region formed in a semiconductor substrate, and the first conductor layer and the second conductor layer are contact plugs.

4. The semiconductor integrated circuit device according to claim 1, wherein the second linear interconnection layer has an interconnection line width in a direction perpendicular to a length direction of the second linear interconnection layer, and the first conductor layer and the second conductor layer have an interconnection line width in the direction perpendicular to the length direction of the second linear interconnection layer, and the interconnection line width of the first conductor layer and the second conductor layer is equal to the interconnection line width of the second linear interconnection layer.

5. The semiconductor integrated circuit device according to claim 1, wherein a distance between the second linear interconnection layer and the third linear interconnection layer is larger than a minimum dimension prescribed in an interconnection line design rule.

* * * * *